United States Patent

Akeyama et al.

[15] 3,686,698

[45] Aug. 29, 1972

[54] MULTIPLE ALLOY OHMIC CONTACT FOR A SEMICONDUCTOR DEVICE

[72] Inventors: Kenji Akeyama; Norimasa Miyamoto, both of Tokyo, Japan

[73] Assignee: Hitachi, Ltd., both of Tokyo, Japan

[22] Filed: Dec. 24, 1970

[21] Appl. No.: 101,274

[30] Foreign Application Priority Data

Dec. 26, 1969 Japan ....................44/104417

[52] U.S. Cl.........317/234 R, 317/234 L, 317/234 M, 317/234 N, 317/235, 29/591

[51] Int. Cl...............................H01l 3/00, H01l 5/00

[58] Field of Search............317/234, 235, 5, 5.2, 5.3, 317/5.4; 29/589, 590, 591; 148/175, 176, 177

[56] References Cited

UNITED STATES PATENTS

| | | | |
|---|---|---|---|
| 3,172,829 | 3/1965 | Bakker et al. | 317/234 L |
| 3,233,309 | 2/1966 | Emeis | 317/234 L |
| 3,243,324 | 3/1966 | Kodera et al. | 317/234 L |
| 3,280,387 | 10/1966 | Emeis | 317/234 L |
| 3,408,271 | 10/1968 | Reissmueller et al. | 317/234 |
| 3,496,428 | 2/1970 | Devolder | 317/234 N |
| 3,509,428 | 4/1970 | Mankarious et al. | 317/234 N |
| 3,514,675 | 5/1970 | Purdom | 317/234 L |

*Primary Examiner*—John W. Huckert
*Assistant Examiner*—Andrew J. James
*Attorney*—Craig & Antonelli

[57] ABSTRACT

A protruding ohmic contact on a P type or N type semiconductor region is made by depositing an alloy of gold and a conductivity type impurity on the P type or N type region, which is heated up to a eutectic temperature of gold and the semiconductor material and thereafter depositing silver on the alloy contact; the conductivity type impurity used is such as produces the same conductivity type as that of the semiconductor region.

5 Claims, 5 Drawing Figures

INVENTORS

KENJI AKEYAMA & NORIMASA MIYAMOTO

BY Craig, Antonelli, Stewart & Hill.

ATTORNEYS

MULTIPLE ALLOY OHMIC CONTACT FOR A SEMICONDUCTOR DEVICE

This invention relates to a method for forming an ohmic contact with a semiconductor device, particularly to a method for making a protruding electrode including gold on a silicon region of a given conductivity type.

It is an object of the invention to lessen the contact resistance between a semiconductor region and an electrode connected thereto.

It is another object of the invention to improve the electric characteristics of a semiconductor diode in the forward direction thereof.

It is a further object of the invention to increase the selectivity "Q" of a variable capacitance diode.

The method of making an ohmic contact to a semiconductor region according to the present invention comprises the following steps: depositing an alloy of gold and an impurity of the same conductivity type as the semiconductor region on which the electrode is to be formed while the semiconductor region on which the electrode is to be formed while the semiconductor substrate is heated up to a temperature higher than a eutectic point of gold and the semiconductor material such as silicon; and then depositing metal such as silver on the alloy layer of gold and silicon.

These and further objects, features and advantages of the present invention will become more apparent from the following description when taken in conjunction with the accompanying drawing which shows, for purposes of illustration only, several embodiments in accordance with the present invention, and wherein.

A method for making an ohmic contact with a semiconductor device according to this invention will be described hereinafter by reference to some embodiments of a PN junction diode.

Embodiment 1

Figure 1:
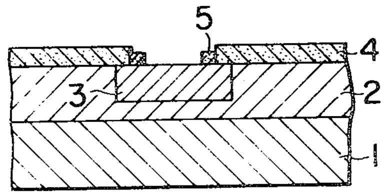
FIGS. 1 to 3 are sectional views of a semiconductor device during the various steps in forming an electrode on a pre-determined portion of a semiconductor substrate surface according to this invention.

As shown in FIG. 1, an N type silicon layer 2 is formed on an N (N-rich) silicon substrate 1 by using a conventional epitaxial growth method, a silicon oxide film 4 is partially formed thereon, a P type diffused region 3 is formed by diffusing an acceptor impurity such as boron into the N type silicon layer 2 through a hole formed in the film 4, another silicon oxide film 5 is formed in the opening of the silicon oxide film 4 during the diffusion step, and then a predetermined surface of the P type diffused region 3 is exposed by selectively etching the silicon oxide film 5.

Figure 2:
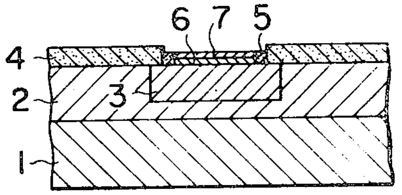

An alloy of gold and a small amount of gallium is prepared. It is desirable that gallium be included in the alloy within a range of about 0.1 to about 10.0 per cent by weight, the optimum content being about 0.8 to about 1.0 per cent by weight. The above-mentioned alloy is evaporated onto the surface of the P type diffused region 3 with a thickness of about 1,000 Angstroms to form a film 6 under the condition of heating the substrate up to a temperature, for example, of about 400° C, higher than the eutectic temperature (about 370° C) of gold and silicon. Then, as shown in FIG. 2, silver is evaporated onto the surface of the alloy film 6 to form a silver layer 7 with about 0.2 microns in thickness keeping the temperature at, for example, 400° C. Actually these films may be evaporated over the whole surface of the substrate including the protective films 4 and 5, and thereafter the metal films on the protective films 4 and 5 may be removed by a conventional etching technique. According to the above steps eutectic alloy of gold and silicon is formed on the P type region 3. In this case, since the silver combines with the gold unalloyed with silicon, the silver is effectively used to prevent the cause of peeling between the alloy of film 6 and the silver layer 7 and thus to prevent the cause of excessive alloying of gold with silicon.

Figure 3:
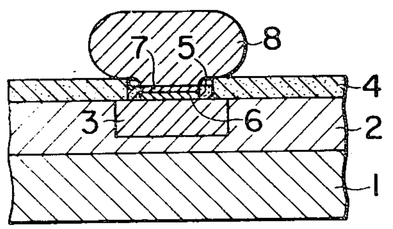

If required, another electrode may be formed on the layer 7. As shown in FIG. 3, silver is thickly deposited as a projection on the silver film 7 by a conventional plating technique described hereinafter, etc., to form a so-called bump electrode with a thickness of about 60 to 80 microns. A compound of potassium cyanide (KCN), potassium carbonate ($K_2CO_3$) and silver cyanide (AgCN) is used as a plating solution for making the bump electrode. The bump electrode may be obtained by utilizing an electroplating method. Since the oxide films 4 and 5 are of dielectric material, the films 4 and 5 act as a mask for electro plating, whence silver is deposited only on the silver film 7.

Embodiment 2

In the case of forming an electrode on an N type semiconductor region, the ohmic contact can be made by a similar method as described in the embodiment 1. A P type silicon substrate is prepared and an impurity of N conductivity type, such as phosphorous, is selectively diffused to form an N type diffused region. After the surface of the substrate is partially covered with an insulating film, an alloy of gold antimony is evaporated onto the surface of the N type region heated up to about 400° C, and then silver is coated on the alloy layer. In this case it is desirable that antimony be included in the alloy within a range of about 0.1 to about 10.0 per cent by weight, the optimum content being about 0.8 to about 1.0 per cent by weight. A eutectic alloy of gold and silicon is formed in the surface of the N type region. Further, if necessary, a bump electrode is formed according to the same step as in the first embodiment.

Embodiment 3

An extremely excellent ohmic contact is realized by combining the methods of embodiments 1 and 2.

Figure 4:
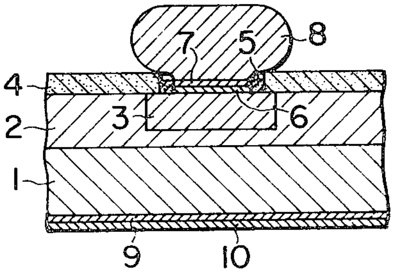
FIG. 4 is a sectional view of another embodiment of a semiconductor device manufactured according to the invention.
Figure 5:
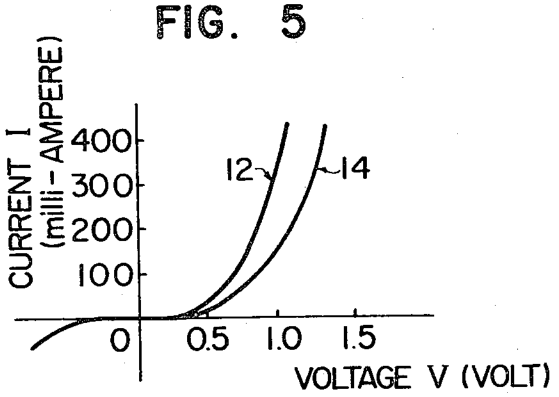
FIG. 5 is a graph of diode characteristics in the forward direction according to the invention and the prior art.

A diode which is made by the process of embodiment 1 is prepared. As shown in FIG. 4 an alloy of gold and antimony is evaporated on the surface of the N type substrate 1 to form an alloy layer 9 of gold and silicon at a temperature of about 400° C. Then a silver layer 10 is formed on the alloy layer 9. A diode or a variable capacitance diode obtained according to this embodiment is greatly improved. In short, the rising characteristic of the diode according to the present invention in the forward direction is transferred from a curve 14, representing the prior art, to a curve 12, as shown in FIG. 5, and the selectivity "Q" of a variable capacitance diode is raised from 200 to a range of 400 to 1,500. Furthermore, since gold and silver is subsequently deposited under the condition that the semiconductor substrate is heated up to a temperature not less than a eutectic temperature of the substrate and gold, a portion of the gold forms a eutectic alloy with the silicon substrate and is firmly connected to the surface of the substrate, and silver combines with the excess gold so that the usual peeling phenomenon of the gold can be prevented.

However, the invention is not limited to a diode. Since according to this invention an impurity of the same conductivity as the diffused region, on which the electrode is to be formed, is slightly doped into the gold and the electrode can be completely ohmically contacted, the present invention can be effectively applied also to any other semiconductor device which requires an ohmic contact of gold.

The contact resistance of an electrode can be reduced by the present invention. For example, the invention can be applied in the case of attaching a silicon chip to metal, and more particularly to attaching the collector of a transistor to a metal seat, i.e., to a so-called stem, on which gold is coated utilizing an alloy of gold and silicon. Hence, an excellent ohmic contact is also obtained, for example, in an NPN transistor between the collector of the chip and the stem, by using an alloy of gold and a donor impurity, for example, antimony between them and heating the stem according to the invention.

While we have shown and described only a few embodiments according to the present invention, it is understood that the same is not limited thereto but is susceptible of numerous changes and modifications as known to those skilled in the art. For example, any other appropriate conductivity type determining impurity known in the art may be used with the present invention which is compatible with the substrate material, the diffused region and gold. Consequently, we do not wish to be limited to the details shown and described herein, but intend to cover all such changes and modification as are encompassed by the scope of the appended claims.

What we claim is:

1. A semiconductor device comprising a semiconductor silicon body of N conductivity type, a semiconductor region of P conductivity type, an alloy contact of gold and gallium formed on said P conductivity type semiconductor region through an eutectic alloy layer of silicon, gallium and gold which is formed between said alloy contact and said semiconductor body, a silver layer formed on said alloy contact, and a silver bump formed on said silver layer.

2. The semiconductor device according to claim 1, wherein said gallium is included in said alloy contact within a range of about 0.1 to about 10.0 per cent by weight.

3. The semiconductor device according to claim 1, wherein said gallium is included in said alloy contact within a range of about 0.8 to about 1.0 per cent by weight.

4. A semiconductor diode comprising a semiconductor substrate of an N conductivity type, a semiconductor region of a P conductivity type formed in a major surface of said semiconductor substrate, a first alloy contact consisting essentially of gold and gallium formed on said semiconductor region, said gallium being included in said first alloy contact within a range of about 0.1 to about 10.0 per cent by weight, a first eutectic alloy layer of the semiconductor material and gold including gallium formed between said first alloy contact and said semiconductor region, a second alloy contact consisting essentially of gold and antimony formed on said semiconductor substrate, where said first alloy contact was not formed, said antimony being included in said second alloy contact within a range of about 0.1 to about 10.0 per cent by weight, and a second eutectic alloy layer of said semiconductor material and gold including antimony formed between said second alloy contact and said semiconductor substrate.

5. A semiconductor diode according to claim 4, further comprising a silver layer formed on said first alloy contact and a bump contact consisting essentially of silver formed on said silver layer.

* * * * *